United States Patent
Namekawa

(10) Patent No.: US 7,656,738 B2
(45) Date of Patent: Feb. 2, 2010

(54) NONVOLATILE SEMICONDUCTOR STORAGE DEVICE HAVING A LOW RESISTANCE WRITE-BIT-LINE AND A LOW CAPACITANCE READ-BIT-LINE PAIR

(75) Inventor: Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 11/968,893

(22) Filed: Jan. 3, 2008

(65) Prior Publication Data

US 2008/0165564 A1    Jul. 10, 2008

(30) Foreign Application Priority Data

Jan. 9, 2007    (JP)    ............... 2007-001666

(51) Int. Cl.
*G11C 8/00*    (2006.01)
(52) U.S. Cl. ............... 365/230.04; 365/225.7; 365/51; 365/205; 365/208; 365/207; 365/190
(58) Field of Classification Search .............. 365/51, 365/96, 225.7, 230.04, 230.03, 190, 208, 365/207, 205
See application file for complete search history.

(56) References Cited

U.S. PATENT DOCUMENTS

2006/0133127 A1    6/2006    Nakano et al.
2008/0165564 A1*   7/2008    Namekawa ............... 365/96

OTHER PUBLICATIONS

U.S. Appl. No. 11/833,054, filed Aug. 2, 2007, Toshimasa Namekawa, et al.
U.S. Appl. No. 11/738,774, filed Apr. 23, 2007, Hiroaki Nakano, et al.
Hiroshi Ito, et al., "Pure CMOS One-time Programmable Memory using Gate-Ox Anti-fuse", Proceedings of the IEEE 2004 Custom Integrated Circuits Conference, 2004, pp. 469-472.
U.S. Appl. No. 11/971,425, filed Jan. 9, 2008, Matsufuji, et al.
U.S. Appl. No. 12/040,297, filed Feb. 29, 2008, Namekawa.
U.S. Appl. No. 12/140,071, filed Jun. 16, 2008, Matsufuji et al.

* cited by examiner

*Primary Examiner*—Andrew Q Tran
(74) *Attorney, Agent, or Firm*—Oblon, Spivak, McClelland, Maier & Neustadt, L.L.P.

(57) ABSTRACT

A memory cell array includes memory cells disposed in a matrix. A plurality of word-lines are arranged in the memory cell array to select a memory cell in a row direction. A read bit-line pair is arranged in a direction perpendicular to the word-line to read data from the memory cell. In addition, a write bit-line is arranged in a direction perpendicular to the word-line to write data to the memory cell. The read bit-line pair includes a true and a complementary read bit-line. One of the true and complementary read bit-lines is connected to the memory cell connected to an even-numbered word-line. The other one is connected to the memory cell connected to an odd-numbered word-line.

15 Claims, 10 Drawing Sheets

NONVOLATILE SEMICONDUCTOR STORAGE DEVICE HAVING A LOW RESISTANCE WRITE-BIT-LINE AND A LOW CAPACITANCE READ-BIT-LINE PAIR

CROSS REFERENCE TO RELATED APPLICATIONS

This application is based on and claims the benefit of priority from prior Japanese Patent Application No. 2007-1666, filed on Jan. 9, 2007, the entire contents of which are incorporated herein by reference.

BACKGROUND OF THE INVENTION

1. Field of the Invention

The present invention relates to a non-volatile semiconductor storage device including a gate-insulator-breakdown antifuse device in a memory cell.

2. Description of the Related Art

A large-capacity semiconductor memory device, an advanced semiconductor logic circuit device, and a high-performance analog circuit device each include a relatively small-capacity non-volatile semiconductor storage device to store various data. The data includes an address of a fault memory element in the large-capacity semiconductor memory device, a chip specific number necessary to manage the advanced semiconductor logic circuit device, and adjustment information to keep uniform characteristics of the high-performance analog circuit. An example of the non-volatile semiconductor storage device is a write-once device including a so-called gate-insulator-breakdown antifuse device as a memory element (see, for example, H. Ito et al. "Pure CMOS One-time Programmable Memory using Gate-OX Antifuse," Proceedings of the IEEE 2004 Custom Integrated Circuits Conference, PP. 469-472).

The gate-insulator-breakdown antifuse device stores data according to an electrical conductivity change due to a breakdown of the transistor's gate insulating layer. The non-volatile semiconductor storage device including the gate-insulator-breakdown antifuse device has following advantages. It needs no additional manufacturing process and is thus manufactured inexpensively. In addition, the storage device does not degrade performance of the semiconductor memory device, the semiconductor logic circuit device, and the analog circuit device that are combined on the same chip.

Information is written to and read from the gate-insulator-breakdown antifuse device as follows. During the write operation, a high voltage of about 6 V is applied to the electrodes of the gate-insulating layer. Under this condition, the gate-insulating layer locally breaks down over time, forming a weak-current path. A high voltage is further applied to the small breakdown spot to pass a relatively large current of about 2 mA. During the write operation, the breakdown spot and the vicinity thereof change in composition, forming a relatively low-resistance conductive path. The write operation is then complete.

During the read operation, a low voltage (e.g., about 1 V) is applied not to break down the antifuse device. The amount of the resulting read current is used to determine whether the stored data is zero or one.

In order for stable operation of the semiconductor memory device including the gate-insulator-breakdown antifuse device, it is important to supply, during the write operation, a sufficiently large write current to sufficiently change the composition of the gate insulating layer's breakdown spot and the vicinity thereof. The write current of about 2 mA or more is thus required.

To satisfy the requirement, the gate-insulator-breakdown antifuse device should be connected with sufficiently low resistance current paths (such as a power supply line, a signal line, a selection gate transistor connecting the memory element and the signal line, and a write buffer for driving the signal line).

An appropriate write current supplied during the writing will not lead to a large cell current during the reading in any way. The read current is centered around about 100 µA and has a large variation, and may have a nonlinear voltage-current characteristics. When, for example, 1 V is applied, the read current may be about 1 µA. A read current of 1 µA is a weak current corresponding to ⅒ to ¹⁄₁₀₀ of the read current of the memory element, such as an SRAM cell, included in other semiconductor memory devices.

This weak read current should be accepted when considering that the conductive path in the gate-insulator-breakdown antifuse device after writing operation is formed by the breakdown phenomenon. In other words, in order to rapidly and accurately determine whether the stored information is zero or one, it is important to reduce parasitic capacitance of various components such as the signal line connected to the memory element, the selection gate connecting the antifuse device and the signal line, and the sense amplifier amplifying the read small signal.

As is evident from the above description, the write characteristics may be effectively improved by increasing the signal line width and the size of the transistor included in the selection gate. In contrast, the read characteristics may be effectively improved by decreasing the signal line width and the size of the transistor included in the selection gate. In this way, in the write-once non-volatile semiconductor storage device including the gate-insulator-breakdown antifuse device as the memory element, the request for the lower resistance for the write operation and the request for the lower capacitance for the read operation are conflicting.

SUMMARY OF THE INVENTION

A non-volatile semiconductor storage device according to an aspect of the present invention includes: a memory cell array including memory cells disposed in a matrix; a plurality of word-lines arranged in the memory cell array, the word-lines being for selecting a memory cell in a row direction; a read bit-line pair arranged in a direction perpendicular to the word-line, the read bit-line pair being for reading data from the memory cell; a write bit-line arranged in a direction perpendicular to the word-line, the write bit-line being for writing data to the memory cell; and a sense amplifier amplifying a potential difference generated across the read bit-line pair, the read bit-line pair including a true and a complementary read bit-line, one of the true and complementary read bit-lines being connected to a memory cell connected to an even-numbered word-line, and the other one being connected to a memory cell connected to an odd-numbered word-line.

DETAILED DESCRIPTION OF THE EMBODIMENTS

With reference to the accompanying drawings, preferred embodiments of the present invention will now be described in more detail.

First Embodiment

Figure 1:
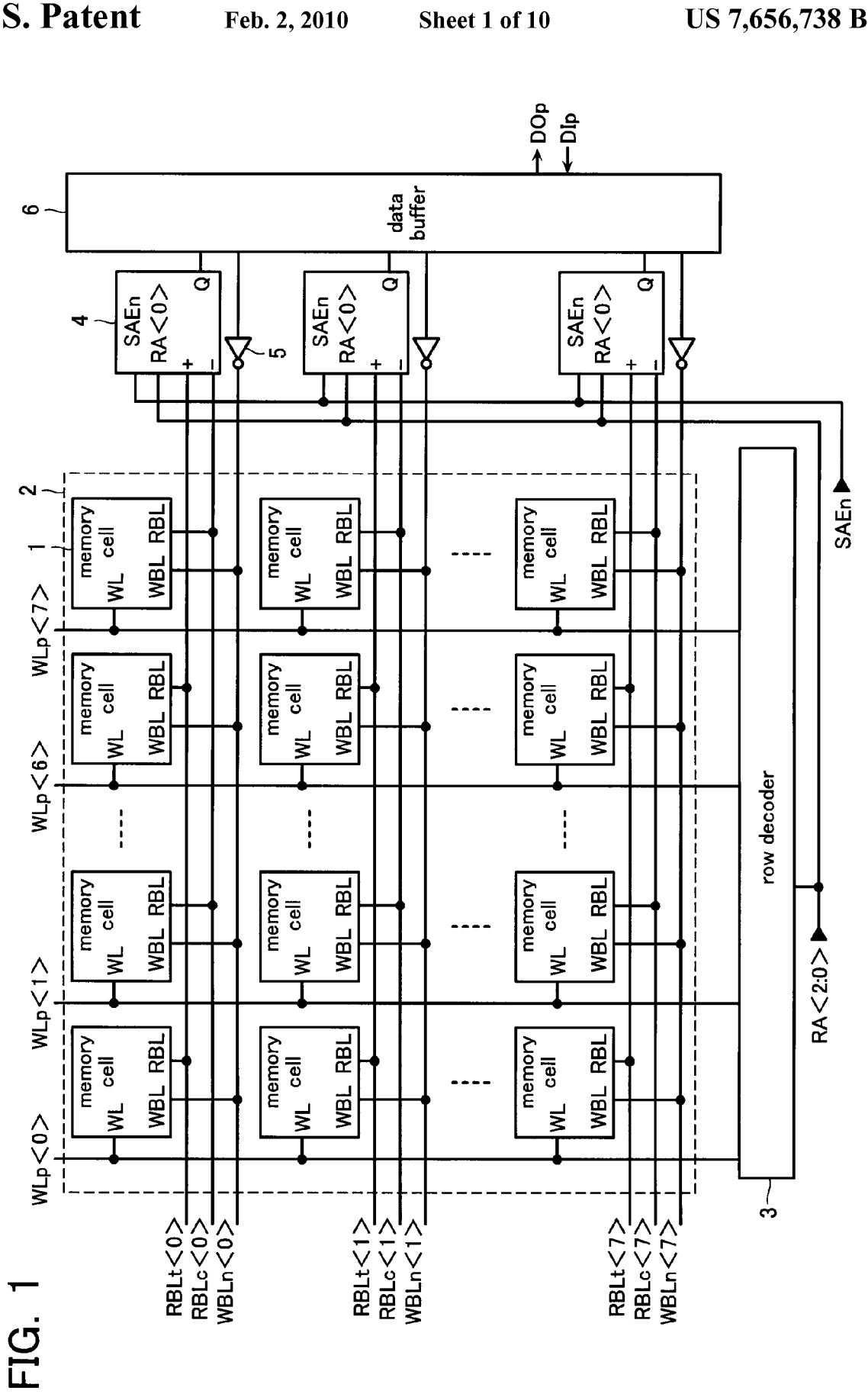
FIG. 1 shows an entire configuration of a non-volatile semiconductor storage device according to a first embodiment of the present invention.

FIG. 1 is a schematic diagram of the configuration of a non-volatile semiconductor device according to a first embodiment of the present invention. In this embodiment, the non-volatile semiconductor device includes a memory cell array 2. The memory cell array 2 includes a plurality of memory cells 1 disposed in a matrix. FIG. 1 shows eight memory cells disposed in the vertical direction (row direction) and eight memory cell disposed in the horizontal direction (column direction), a total of 64 memory cells thus being disposed. It will be appreciated, however, that the present invention is not limited to this embodiment. Specific structures of the memory cell 1 will be described later.

The memory cell array 2 includes a plurality of word-lines WLp <i> (i=0 to 7 in FIG. 1) that extend in the vertical direction (row direction) in FIG. 1. The memory cell array 2 also includes write bit-lines WBLn <j>, pairs of read bit-lines RBLt <j> and RBLc <j> (j=0 to 7 in FIG. 1), all lines extending in the horizontal direction (column direction) in FIG. 1.

Each write bit-line WBLn <j> is a single-line structure wiring (single-ended wiring) that is used during data writing. Each pair of the read bit-lines RBLt <j> and RBLc <j> is a pair of true and complementary wirings (a pair of wirings showing different logic signals during signal reading) that are used during data reading. Note that each memory cell 1 includes a plate electrode (not shown) that applies a high voltage of about 6 V during the writing and a low voltage of about 1 V during the reading.

One word-line WLp <i> is commonly connected to a plurality of (here, eight) memory cells 1 arranged in the row direction. The word-lines WLp <i> are driven by a row decoder 3. The word-lines WLp <i> are then selectively activated by a row address RA <2:0> provided to the row decoder 3.

One write bit-line WBLn <j> is commonly connected to a plurality of (here, eight) memory cells 1 arranged in the column direction. The write bit-line WBL <j> is driven by a write buffer 5.

The read bit-lines RBLt <j> and RBLc <j> extend in parallel with the write bit-line WBLn <j> in the column direction. Among the plural memory cells 1 (eight cells 1 in FIG. 1) arranged in the column direction, half thereof are connected to the read bit-lines RBLt <j>, and the rest thereof are connected to the read bit-lines RBLc <j>. Commonly connected to each true read bit-line RBLt <i> are even-numbered memory cells 1 of the memory cells 1 arranged in the column direction. Commonly connected to each complementary read bit-line RBLc <i> are odd-numbered memory cells 1. Alternatively, the odd-numbered memory cells 1 may be commonly connected to the true read bit-line RBLt <i> and the even-numbered memory cells 1 may be commonly connected to the complementary read bit-line RBLc <i>.

A sense amplifier 4 has a true input terminal (+) and a complementary input terminal (−). The read bit-lines RBLt <j> and RBLc <j> connect to the true input terminal (+) and the complementary input terminal (−), respectively.

The output terminal of the sense amplifier 4 and the input terminal of the write buffer 5 connect to a data buffer 6. The data buffer 6 includes a data output terminal DOp and a data input terminal DIp. The data buffer 6 controls data transfer between the memory cell array 2 and an external device.

Figure 2:
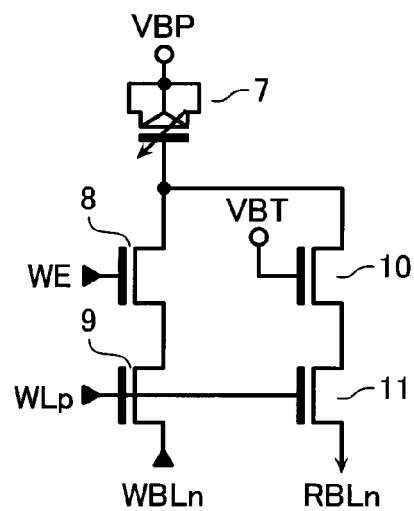
FIG. 2 shows an example configuration of the memory cell 1 according to the first embodiment.

FIG. 2 shows a detailed structure of the memory cell 1. The memory cell 1 includes a memory element such as a dielectric breakdown antifuse device 7, a write control device 8, a write selection device 9, a barrier device 10, and a read selection device 11. The antifuse device 7 includes, for example, a p-type MOS transistor with its source/drain terminals and substrate being shorted. The device 7 is adapted to allow application of a high voltage to the source/drain terminals from a write power supply VBP to break down a gate insulating layer. This may thus irreversibly change the resistance of the gate insulating layer, thereby writing information to the device 7.

The write control device 8 and the write selection device 9 are connected in series between the gate terminal of the antifuse device 7 and the write bit-line WBLn. It is assumed here that the write control device 8 and the write selection device 9 both include an n-type MOS transistor. The write control device 8 turns on when a write control signal WE rises. The write selection device 9 turns on when the word-line WLp is selected.

The barrier device 10 and the read selection device 11 are connected in series between the gate terminal of the antifuse device 7 and one of the pair of the read bit-lines RBLt and RBLc (depending on whether the relevant memory cell is the even-numbered or odd-numbered cell in the column direction). It is also assumed here that the barrier device 10 and the read selection device 11 both include an n-type MOS transistor. The barrier device 10 has a gate. With a barrier power supply VBT being applied to the gate, the device 10 serves to suppress application of a high voltage to the read selection device 11 from the write power supply VBP. The write power supply VBP, the barrier power supply VBT, and the write control signal WE are supplied commonly to all memory cells 1. This is not shown in FIG. 1 for clarity. The read selection device 11 turns on when the word-line WLp is selected.

Read and write operations to the memory cell 1 shown in FIG. 2 will now be described. In FIG. 2, the antifuse device 7 includes a p-type MOS transistor. The device 7 has a high resistance at the normal state before its gate insulating layer is broken down. The device 7 also has a low resistance when a high-voltage application breaks down the gate insulating layer. The antifuse device 7 holds, for example, data "0" at the high resistance state and data "1" at the low resistance state.

The write operation is performed using, for example, the following procedure. First, the write power supply VBP is set to a potential high enough to break down the gate insulating layer of the antifuse device 7. In order to prevent application of an unnecessary high voltage stress to the antifuse device 7, the write control device 8, the write selection device 9, the barrier device 10, and the read selection device 11, the barrier power supply VBT, the write control signal WE, the row selection signal WL, the write bit-line WBL, and the read bit-lines RBLt and RBLc are set to a certain high potential at the same time. When, for example, a p-type MOS transistor that usually operates with a 1.2 V power supply is used in the antifuse device 7 and an n-type MOS transistor that usually operates with a 3 V power supply is used in the other control devices, it is appropriate that the write power supply VBP is set to a potential of 6 V and the others (WE, WL, WBL, and lines RBLt and RBLc) are set to a potential of 3 V.

Next, the word-line WL connected to the memory cell 1 to be written is set to a selection state i.e., a high potential of 3 V. The other word-lines WL connected to the memory cells 1 not to be written are set to an unselected state i.e., a low potential of 0V. The write bit-line WBL connected to the memory cell 1 to be written is set to a low potential of 0 V to instruct write operation. The other write bit-lines WBL remain at a high potential of 3 V.

Likewise, each of the read bit-lines RBLt and RBLc is set to a low potential of 0 V when it is connected to the memory cell 1 to be written, and is set to a high potential of 3 V when it is connected to the memory cell 1 not to be written. Alternatively, all pairs of the read bit-lines RBLt and RBLc may be set to a high impedance. One of the memory cells 1 is thus selected to which the high-potential word-line WLp and the low-potential write bit-line WBLp are connected. Writing data is then performed.

A voltage of 6 V is applied across the antifuse device 7 of the selected memory cell 1 from the write power supply VBP. Under this condition for about 100 μs, the gate insulating layer of the antifuse device 7 of the selected memory cell 1 breaks down. The breakdown locally occurs leaving a pin hole with a diameter of about 50 nm. A high voltage is further applied to the small breakdown spot, passing a relatively large current of 2 mA or more. During the write operation, the breakdown spot and the vicinity thereof change in composition, forming a relatively low-resistance conductive path. Then the voltage applied from the write power supply VBP is turned off, thereby stopping the write operation.

The data read operation from the memory cell 1 in FIG. 2 will now be described. First, with all word-lines WL and write control signals WE held at 0 V, the write power supply VBP is set to a potential low enough not to break down the gate insulating layer, such as 1.2 V. In order to render the barrier device 10 conductive, the barrier power supply VBT is set to a high potential such as 1.8 V. Under this condition, the potential of the read bit-line RBL is initialized. Preferably, the potential of the read bit-line RBL is relatively low, e.g., about 0.2 V, so that a sufficient potential is applied to the antifuse device 7.

The read bit-lines RBLt and RBLc are then set to a high impedance state or a state that produces a bias current of about 1 μA. The word-line WL is then selectively set to a high potential of, for example, 1.8 V. Note that in the read operation, the write bit-line WBL may be a low potential of 0 V or a high potential (for example about 1.8 V) without breaking down the device. Under this condition, when the antifuse device 7 stores data of one (1), the device 7 has a low resistance, and so one of the read bit-lines RBLt and RBLc has a potential higher than the initial potential 0.2 V. Conversely, when the antifuse device 7 stores data of zero, the device 7 has a high resistance, and so one of the read bit-lines RBLt and RBLc keeps the initial potential 0.2 V or has a lower potential drawn by the bias current. This potential difference may be sensed to determine whether the memory cell 1 stores data zero or one (1).

In this embodiment, as shown in FIG. 1, each write bit-line WBLn <j> has a single-line structure (single-ended wiring), while each pair of the read bit-lines RBLt <j> and RBLc <j> forms a pair of differential wirings. The advantage of this structure will be described below.

In the write operation, in order to change the composition of the breakdown spot of the antifuse device 7 and the vicinity thereof, a large current needs to be supplied to the memory cell 1. Because the current is supplied via the bit-line WBLn <j>, the bit-line WBLn <j> should have a lower wiring resistance. For this purpose, the bit-line WBLn <j> should have a larger line width.

An insufficiently large bit-line width will limit the bit-line length. Consider, for example, the case where the write current is 10 mA, and this current is supplied through a write bit-line with an wiring width of 0.5 μm and an wiring length of 0.5 mm, the bit line being made of an wiring material having a resistance per unit area of 0.2Ω. Because the write bit-line WBLn <j> has a resistance of 200Ω, a current of 10 mA through the bit-line causes a potential drop of 2 V. When the write power supply VBP is set to a voltage of 6 V, one-third of the entire energy will be consumed by the bit-line. This may cause an inappropriate change in the composition of the antifuse device 7, thereby providing poor electrical properties.

In contrast, when the wiring width is increased to 2 μm, which is four times as large as 0.5 μm, the resistance of the bit-line may be reduced to 50Ω and the potential drop thereacross may be reduced to 500 mV. In this way, it is needed to increase the wiring width of the write bit-line. The width may be effectively increased in the limited wiring area by forming the write bit-line in a single end structure.

In the read operation, because the memory cell 1 provides a small read current of a few μA, rapidly reading information therefrom requires a smaller parasitic capacitance of the read bit-line. Further, in order to rapidly read the small potential difference generated in the read bit-line, it is necessary to use a reference power supply and a differential amplifier to amplify the resulting potential difference. Consider, for example, the case of 256 memory cells 1 being connected to the read bit-line having an wiring width of 0.2 μm and an wiring length of 0.5 mm. The read bit-line has a parasitic capacitance of up to 2 pF. When a read current of 2 μA is obtained from the memory cell 1 storing information, i.e., from the low-resistance antifuse device 7, the read bit-line has a potential difference of up to only 10 mV after 10 nS has passed after the word-line is activated. Sensing such a small potential difference requires a reference potential that is controlled more accurately than 10 mV. The controlled reference potential may be effectively obtained by providing a reference bit-line that is the same in structure as the read bit-line. A dedicated reference bit-line leads, however, to a lower area efficiency.

The non-volatile semiconductor storage device according to this embodiment thus includes the pair of two read bit-lines: the true read bit-line RBLt <j> and the complementary read bit-line RBLc <j>. The even-numbered memory cell 1 is connected to the true line RBLt <j> and the odd-numbered memory cell 1 is connected to the complementary line RBLc <j>, thereby providing the reference bit-line.

When the even-numbered memory cell 1 is selected, the complementary read bit-line RBLc <j> is used for the reference potential, and the potential difference of the true read bit-line RBLt <j> is sensed. Conversely, when the odd-numbered memory cell 1 is selected, the true read bit-line RBLt <j> is used for the reference potential, and the potential difference of the complementary read bit-line RBLc <j> is sensed. In this way, the pair of the read bit-lines RBLt <j> and RBLc <j> are provided and the potential difference across the read bit-line pair is sensed, thereby amplifying the electrical signal from the memory cell 1. This method is embodied in a means generally used in a DRAM or the like. In the above structure, the sense amplifier 4 may include a simple differential amplifier.

It is expected that such the differential wiring structure may reduce the number of memory cells connected to one read bit-line to half and also reduce the parasitic capacitance of the read bit-line. In the foregoing example, the number of memory cells 1 is reduced to half from 256 to 128, thereby reducing the parasitic capacitance to about 1.5 pF. This effect may increase the potential difference between the read bit-lines to 13 mV.

Figure 3:
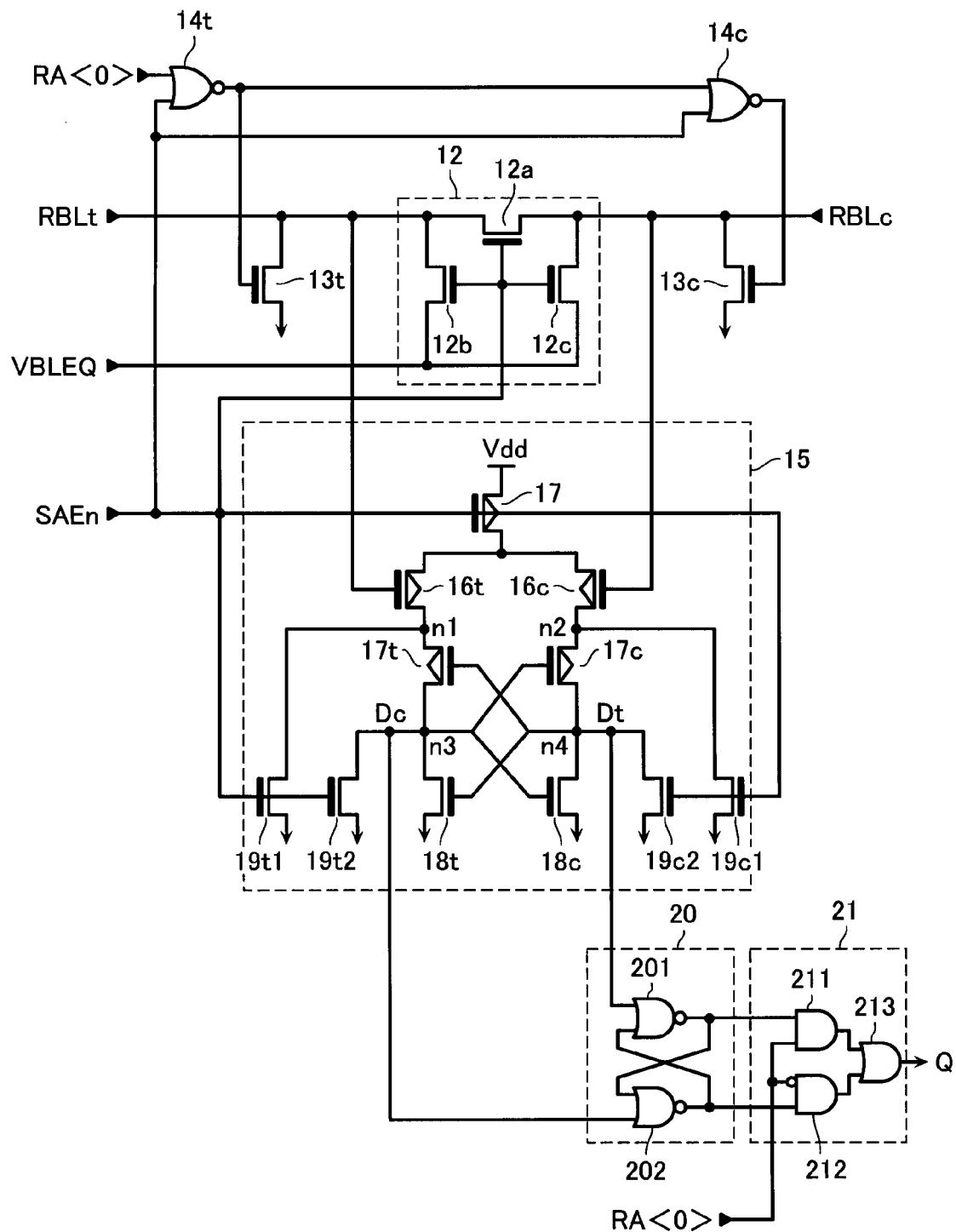
FIG. 3 shows an example configuration of the sense amplifier 4 in FIG. 1.

FIG. 3 shows an example configuration of the sense amplifier 4 that may be used in the first embodiment. In FIG. 3, the sense amplifier 4 includes an equalizer circuit 12 for short-circuiting a pair of read bit-lines RBLt and RBLc to set the two read bit-lines to the same potential. The equalizer circuit 12 includes three n-type MOS transistors 12a, 12b, and 12c. The transistor 12a is connected between the read bit-lines RBLt and RBLc. Each of the transistors 12b and 12c has first end connected to the transistor 12a. Each of the three transistors 12a to 12c has a gate, which receives a sense-amplifier activation signal SAEn to activate the sense amplifier 4. Each of the transistors 12b and 12c has a second end supplied with an equalize power supply VBLEQ.

Between the read bit-line RBLt and the ground potential, a true constant-current-bias circuit 13t is connected. Between the read bit-line RBLc and the ground, a complementary constant-current-bias circuit 13c is connected. Each of the bias circuits 13t and 13c includes an n-type MOS transistor.

The true constant-current-bias circuit 13t has a gate, which receives a control signal from a true bias-current control circuit 14t as described below. The complementary constant-current-bias circuit 13c has a gate, which receives a control signal from a complementary bias-current control circuit 14c as described below.

The true bias-current control circuit 14t receives the least significant signal RA <0> of the row address and the sense-amplifier activation signal SAEn. The true bias-current control circuit 14t has a function of flowing a bias current of 1 µA through the true read bit-line RBLt when it is determined that the even-numbered memory cell 1 is selected.

The complementary bias-current control circuit 14c receives the least significant signal RA <0> of the row address and the sense-amplifier activation signal SAEn. The complementary constant-current-bias circuit 13c has a function of flowing a bias current of 1 µA through the complementary read bit-line RBLc when it is determined that the odd-numbered memory cell 1 is selected.

The sense amplifier 4 also includes a differential amplifier 15. The differential amplifier 15 includes a constant-current source 17 including a p-type MOS transistor, differential-input devices 16t and 16c as a p-type MOS transistor, p-type dynamic load resistors 17t and 17c as a p-type MOS transistor, and n-type dynamic load resistors 18t and 18c as an n-type MOS transistor.

The constant-current source 17 has a source supplied with a power supply voltage Vdd. The source 17 also has a drain connected to the sources of the differential-input devices 16t and 16c. The source 17 also has a gate, which receives the sense-amplifier activation signal SAEn.

The differential-input devices 16t and 16c have gates, which are connected to the respective read bit-lines RBLt and RBLc. The differential-input devices 16t and 16c have drains, which are connected to first ends (sources) of the p-type dynamic load resistors 17t and 17c at nodes n1 and n2, respectively.

The p-type dynamic load resistors 17t and 17c have second ends (drains) connected to first ends (drains) of the n-type dynamic load resistors 18t and 18c at nodes n3 and n4, respectively. The n-type dynamic load resistors 18t and 18c have second ends (sources) grounded.

The connection node n3 (which is an output node of a signal Dc as described below) exists between the p-type dynamic load resistor 17t and the n-type dynamic load resistor 18t. The node n3 connects to the gates of the p-type dynamic load resistor 17c and the n-type dynamic load resistor 18c. The connection node n4 (which is an output node of a signal Dt as described below) exists between the p-type dynamic load resistor 17c and the n-type dynamic load resistor 18c. The node n4 connects to the gates of the p-type dynamic load resistor 17t and the n-type dynamic load resistor 18t.

The differential amplification circuit 15 also includes discharge circuits 19t1, 19t2, 19c1, and 19c2. The circuits initialize the potentials at the respective nodes n1 to n4 to the ground potential Vss. Each of the discharge circuits 19t1, 19t2, 19c1, and 19c2 includes an n-type MOS transistor. The discharge circuits have drains, which are connected to the respective nodes. Each discharge circuit has a source connected to the ground potential. Each discharge circuit is activated by a change of the sense-amplifier activation signal SAEn to "high."

The differential amplifier 15 is controlled by the sense-amplifier activation signal SAEn. When the sense-amplifier activation signal SAEn is a high state (non-activated state), the amplifier's internal state is initialized. When then the sense-amplifier activation signal SAEn is a low state (activated state), the differential amplifier 15 operates as follows. The amplifier 15 differentially amplifies the potential difference between the read bit-lines RBLt and RBLc, thereby outputting the signals Dt and Dc. The read bit-lines RBLt and RBLc connect to the differential-input devices 16t and 16c, respectively.

If the true read bit-line RBLt is higher in potential than the complementary read bit-line RBLc, the signal Dt is changed to a high state. If the RBLt is lower in potential than the RBLc, the signal Dc is changed to a high state. The signals Dt and Dc are effective only when the sense-amplifier activation signal SAEn is a low state. When the sense-amplifier activation signal SAEn is changed to a high state, the signals Dt and Dc are both initialized to a low state.

A latch circuit 20 connects to the nodes n3 and n4. The latch circuit 20 includes two NOR circuits 201 and 202. The output terminal of one NOR circuit is connected to the input terminal of the other NOR circuit. The latch circuit 20 may thus latch an input signal.

The latch circuit 20 provides complementary output signals, which are input to the selection switch 21. The selection switch 21 includes logic gates 211 to 213. The logic gate 211 has one input terminal supplied with an output signal (true or complementary) from the latch circuit 20. The gate 211 has the other input terminal supplied with the least significant signal RA <0> of the row address. The logic gate 212 has one input terminal supplied with an output signal (complementary or true) from the latch circuit 20. The gate 212 has the other input terminal supplied with the least significant signal RA <0> of the row address. The logic gate 213 outputs a logical OR of output signals of the logic gates 211 and 212.

When the row-address least significant signal RA <0> is low, i.e., the even-numbered memory cell is selected, the selection switch 21 outputs, as an output signal Q, positive logic data (which corresponds to the latch data of the latch circuit 20). When the row-address least significant signal RA <0> is high, i.e., the odd-numbered memory cell is selected, the selection switch 21 outputs, as the output signal Q, negative logic data (derived by inverting the latch data of the latch circuit 20).

The function of the selection switch 21 is to make the output signal Q is low, (i.e., zero) when the antifuse device 7 included in the relevant memory cell 1 is not programmed, regardless of whether the selection switch 21 selects the even-numbered memory cell 1 or the odd-numbered memory cell 1. When the antifuse device 7 is programmed, the output signal Q is high, i.e., one (1). In other words, if the selection switch 21 is not provided, the output signal Q (the output signal of the latch circuit 20) when the even-numbered "one (1)" stored memory cell 1 is read is different from that when the odd-numbered "one (1)" stored memory cell 1 is read. Such an issue is avoided by the selection switch 21.

Figure 4:
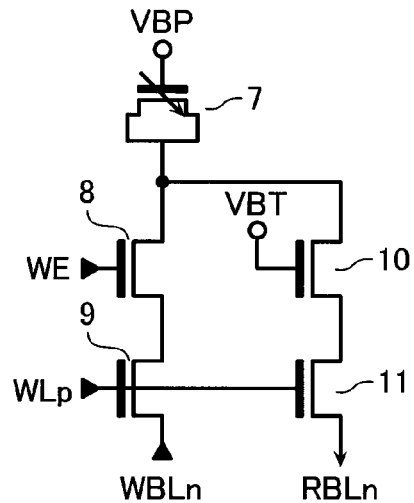
FIG. 4 shows an example configuration of the memory cell 1 according to the first embodiment.

FIG. 4 shows another example configuration of the memory cell 1. The memory cell 1 in FIG. 4 differs from the memory cell 1 in FIG. 2 in structure in that it includes an n-type MOS transistor as the antifuse device 7. In addition, the write voltage VBP is applied to the gate terminal, and the source/drain substrate is connected to the write control device 8. Again, a high voltage may be applied between the source/drain and the gate to break down the gate insulating layer of the antifuse device 7 for writing data.

Figure 5:
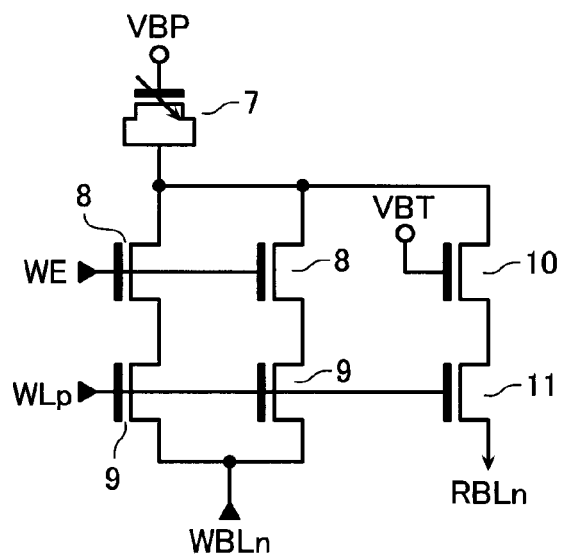
FIG. 5 shows another example configuration of the memory cell 1 according to the first embodiment.

FIG. 5 shows still another example configuration of the memory cell 1. The memory cell 1 in FIG. 5 differs from the memory cell 1 in FIG. 4 in structure in that the write bit-line WBL is connected to a plurality of write control devices 8 (two devices 8 in FIG. 5) and a plurality of write selection devices 9 (two devices 9 in FIG. 5), and the sets of the control device 8 and selection device 9 are connected in parallel. The write control devices 8 have gates, which are commonly connected to the write control signal WE. The write selection devices 9 have gates, which are commonly connected to the word-line WL. The memory cell 1 in FIG. 5 may thus provide a larger current driving capability than the memory cell 1 in FIG. 4.

Note that because the memory cells 1 shown in FIGS. 2 and 4 also need a larger current driving capability during the writing, it is preferable to set the transistor sizes of the write control device 8 and the write selection device 9 in FIGS. 2 and 4 to be larger than those of the barrier device 10 and the read selection device 11.

Figure 6A:
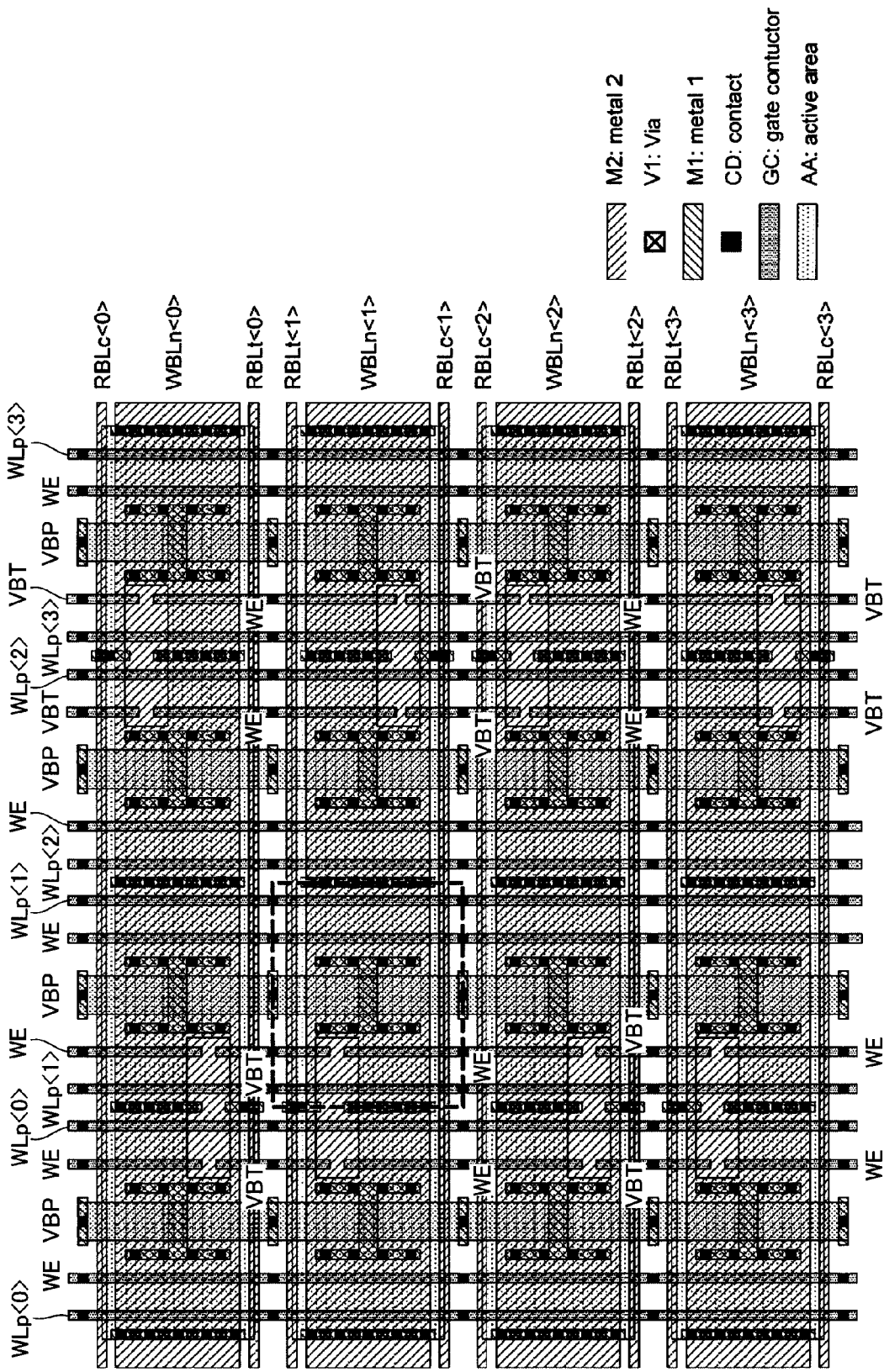
FIG. 6A shows an example of a layout of the memory cell array 2 according to the first embodiment.
Figure 6B:
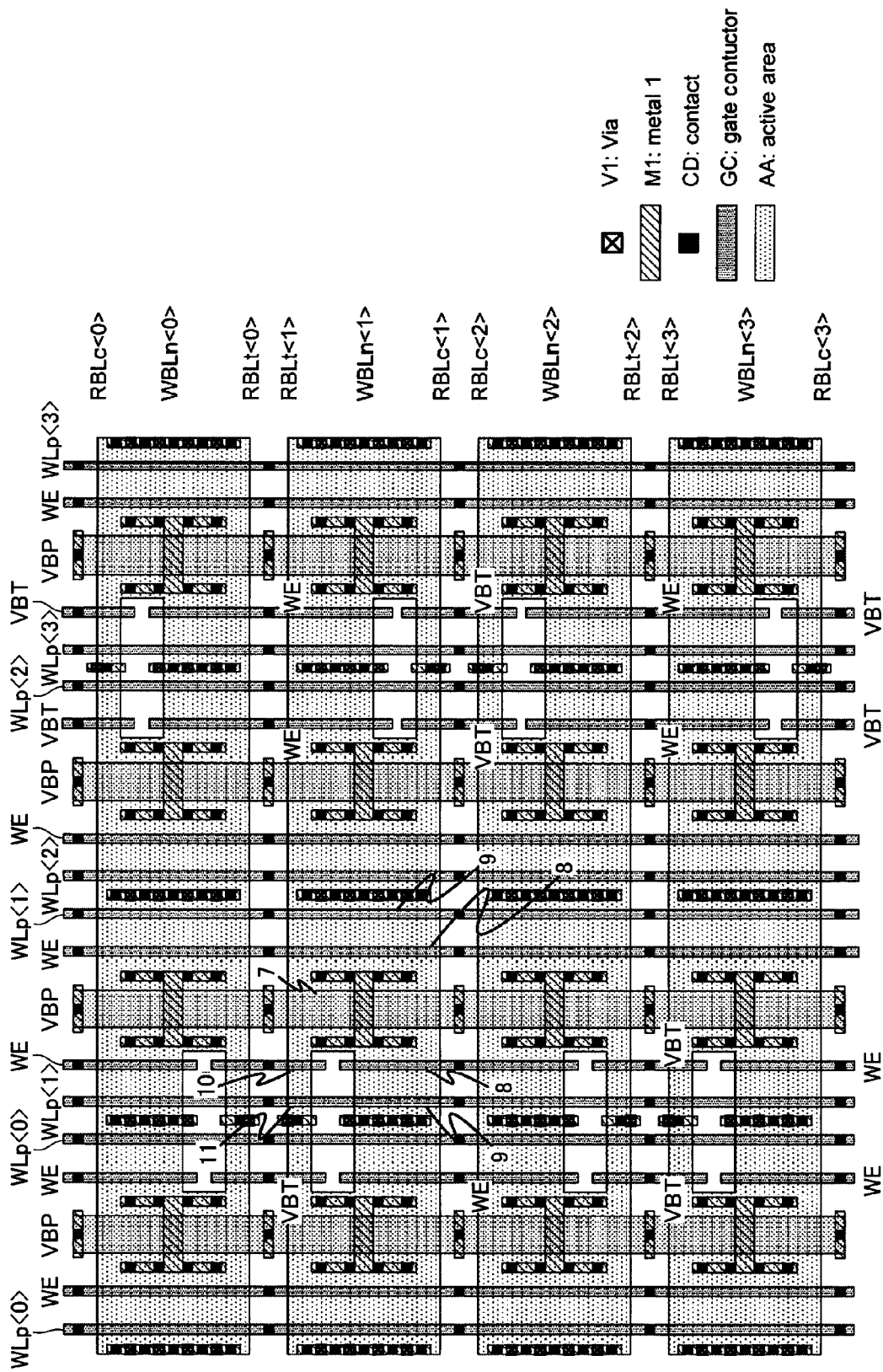
FIG. 6B shows another example of a layout of the memory cell array 2 according to the first embodiment.
Figure 6C:
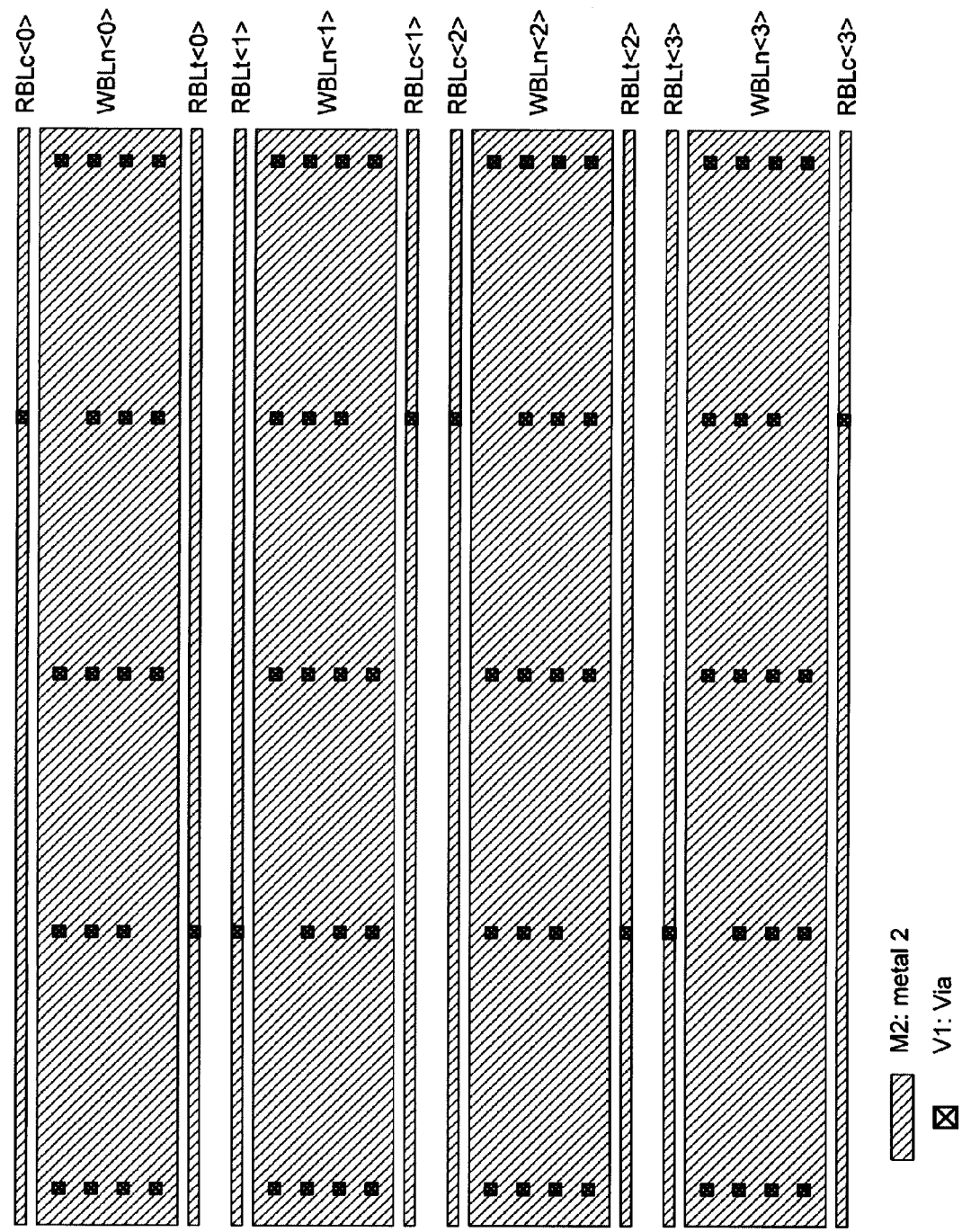
FIG. 6C shows another example of a layout of the memory cell array 2 according to the first embodiment.

FIGS. 6A, 6B, and 6C show layouts of the memory cell 1 in FIG. 5. With reference to FIG. 6A, the memory cell includes, from the lower layer (on the semiconductor substrate side) to the upper layer, the following six layers in sequence:
(1) an active area AA;
(2) a gate wiring GC;
(3) a contact hole CD that connects the active area AA or the gate wiring GC and a first-layer metal wiring M1;
(4) the first-layer metal wiring M1;
(5) a via V1 that connects a second-layer metal wiring M2 and the first-layer metal wiring M1; and
(6) the second-layer metal wiring M2.

In FIG. 6A, a thick dotted line denotes an area where one memory cell 1 is formed.

FIG. 6B shows a layout without the upper-layer metal wiring M2 and the via V1. FIG. 6C shows a layout of only the metal wiring M2 and the via V1.

In FIG. 6B, the antifuse device 7 and the transistors 8 to 11 shown in FIG. 5 are located using the corresponding numbers. Note that bulk terminals are disposed across the lower layers of all transistors, which is not shown in FIGS. 6A to 6C.

Each layer's configuration will be described below.

Each active area AA serves as a semiconductor diffusion area for various transistors formed on the semiconductor substrate. In FIG. 6B, each active area AA is continuously formed in the longitudinal direction that corresponds to the longitudinal (column) direction of the bit-lines WBL and RBL. The sources/drains of the adjacent antifuse devices 7 and transistors 8 to 11 share each other's areas. The active areas AA thus form successive shapes.

The gate wiring GC is used as a wiring to form the word-line WLp <i>, the write control signal WE, and the barrier power supply VBP. These are formed over the active area AA via the gate insulating layer. The active areas AA and the gate wirings GC overlap in overlapping areas. The overlapping areas serve as channel areas for the antifuse devices 7 and various transistors such as the transistors 8 to 11. The active areas AA adjacent to the overlapping areas serve as the source/drain areas for the antifuse device 7 and transistors 8 to 11. Note that the active areas AA on both sides of the gate wiring GC for the write power supply VBP are shorted by the metal wiring M1 and the contact hole CD. Not-shown bulk terminals are also shorted. The antifuse devices 7 are thus formed. The shorted active area AA is connected to the write control device 8, which shares the area AA.

The write control device 8 and the write selection device 9 are disposed in wide areas on both sides sandwiching the antifuse device 7. The barrier device 10 and the read selection device 11 are formed in narrow areas of the active area AA. The write control device 8 and the write selection device 9 have channel sizes about eight times as large as the channel sizes of the barrier device 10 and the read selection device 11.

The memory cells 1 are arranged axisymmetrically around the gate wiring GC of the write power supply VBP in the bit-line direction (the horizontal direction in FIGS. 6A to 6C). The adjacent memory cells 1 arranged in the horizontal direction share the active areas AA. The active areas AA thus form successive shapes in the lateral direction, thereby increasing the packaging density.

In the word-line direction (the vertical direction or the row direction in FIGS. 6A to 6C), the memory cells 1 are opposed across the read bit-lines RBLt <j−1> and RBLt <j> and arranged axisymmetrically around these bit-lines. The gate wirings GC, for example, form successive shapes in the vertical direction. The gate wirings GC provide the word-lines (WLp <i>) in the vertical direction. Note that the addresses of the word-lines (WLp <i>) are not distributed uniformly. Again, the active areas AA and the gate wirings GC may share each other between the adjacent memory cells 1, thereby forming the active areas AA and the gate wirings GC as successive shapes. The packaging density may thus be increased.

The write control signal WE and the barrier power supply VBT are provided by the metal wiring M1 in the vertical direction. The signal WE and the power supply VBT are connected to the gate terminals of the write control device 8 and the barrier device 10, respectively. Further, the write power supply VBP, the write control signal WE, and the barrier power supply VBT are also provided by the metal wiring layer M2 in the lateral direction. The vertical wirings and the lateral wirings are connected at the respective intersections. Particularly, the write power supply VBP has a lattice structure, which may efficiently pass a large current during the write operation.

FIG. 6C shows the four write bit-lines WBLn <j> and the four pairs of the read bit-lines RBLt <j> and RBLc <j>. The write bit-lines WBLn <j> are disposed between the respective pairs of the read bit-lines RBLt <j> and RBLc <j>, using the metal wirings M2 provided in the lateral direction. FIG. 6C shows that the ratio of the wiring widths between the write bit-line WBLn <j> and each of the read bit-lines RBLt <j> and RBLc <j> is about 12:1. This configuration may satisfy the conflicting requests: the request for the lower resistance of the write bit-line and the request for the lower parasitic resistance of the read bit-line. Specifically, a large current may thus be supplied during the writing, thereby providing a good writing condition. In addition, a small current may be efficiently amplified during the reading, thereby providing rapid and accurate reading characteristics.

Second Embodiment

Figure 7:
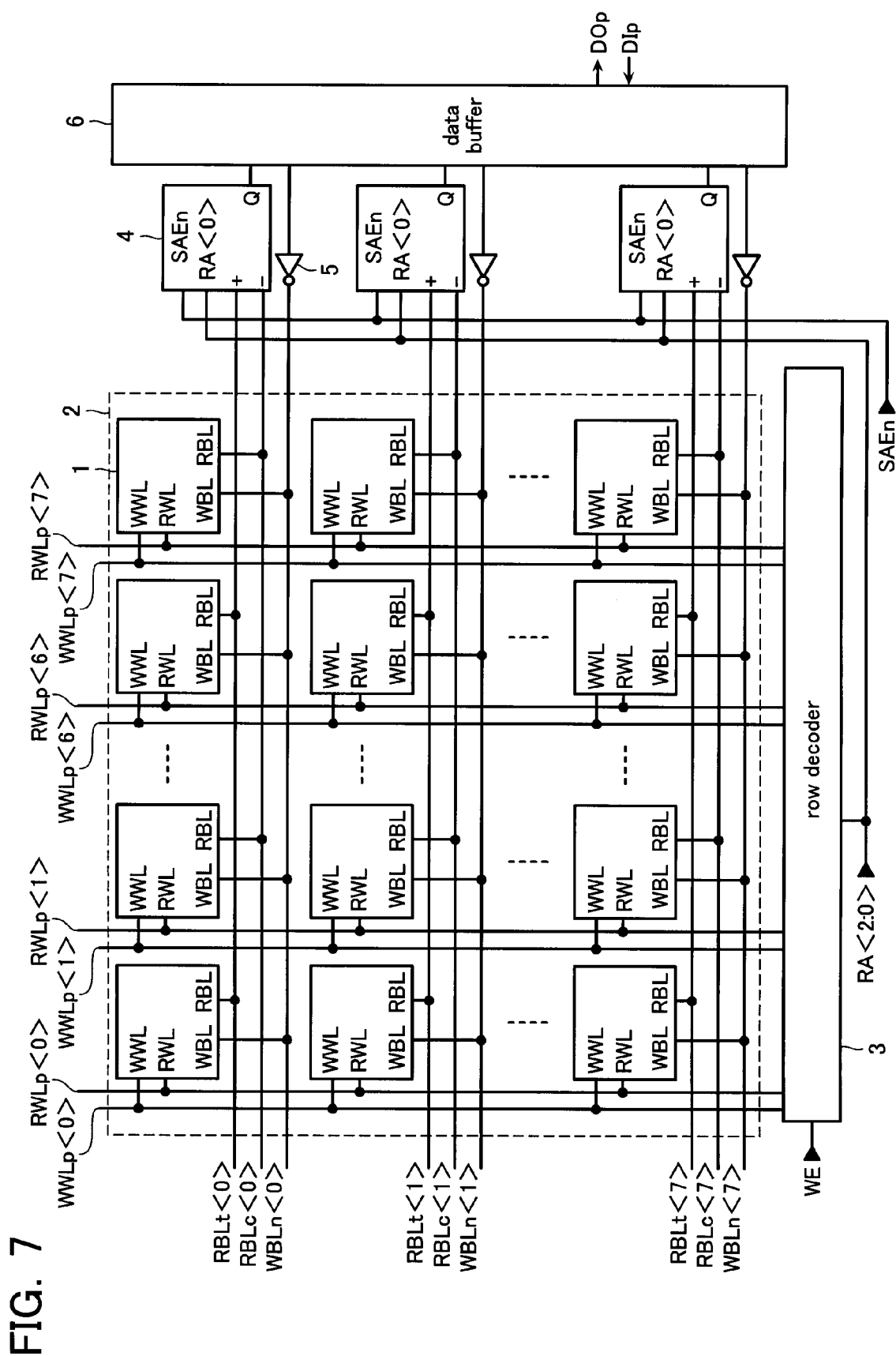
FIG. 7 shows an entire configuration of a non-volatile semiconductor storage device according to a second embodiment of the present invention.

FIG. 7 shows a second embodiment of the present invention. In FIG. 7, like elements as those in the first embodiment are designated with like reference numerals, and their detailed description is omitted here.

The second embodiment differs from the first embodiment in that two types of word-lines are provided including write word-lines WWLp <i> and read word-lines RWLp <i>, and the two types of word-lines are connected to the write selection terminals WWL and the reading selection terminals RWL, respectively, of the memory cell 1. Among the plural write word-lines WWLp <i>, any one of them at a row is activated by the row-address signal RA <2:0> during the write operation. Among the read word-lines RWLp <i>, any one of them at a row is activated by the row-address signal RA <2:0> during the read operation.

In this way, this embodiment activates the different word-lines depending on the two operation states of write/read operations. The row decoder 3 is thus supplied with the write control signal WE for the instruction of the write operation. Other operations are similar to those in the first embodiment, and so their detailed description is omitted here.

Figure 8:
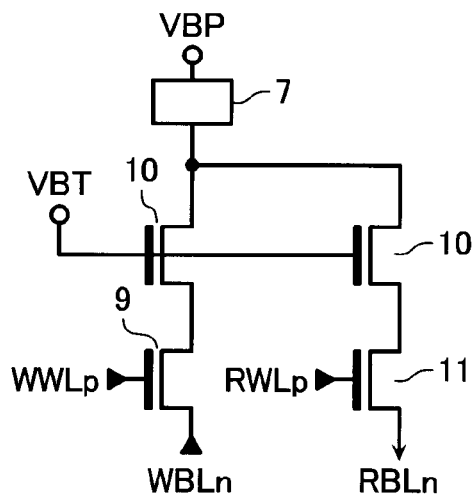
FIG. 8 shows an example configuration of the memory cell 1 according to the second embodiment.

FIG. 8 shows an example configuration of the memory cell 1 that may be used in the second embodiment. With reference to FIG. 8, the memory cell 1 includes the antifuse device 7, the write selection device 9, the two barrier devices 10, and the read selection device 11. One barrier device 10 and the write selection device 9 are connected in series between the antifuse device 7 and the write bit-line WBLn. The other barrier device 10 and the read selection device 11 are connected in series between the antifuse device 7 and the read bit-line RBLn.

The write selection device 9 has a gate, to which the write word-line WWLp is connected. The device 9 is thus selectively rendered conductive during the writing. The read selection device 11 has a gate, to which the read word-line RWLp is connected. The device 11 is thus selectively rendered conductive during the reading.

The barrier device 10 is provided to prevent the application of the high voltage stress to the write selection device 9 and the read selection device 11. The device 10 has a gate, to which the barrier power supply VBT is connected.

Note that the device 7 and the devices 9 to 11 may be embodied by various semiconductor devices. Particularly, the antifuse device 7 may be embodied by any semiconductor device that changes its electrical properties before and after a stress is applied by a high voltage and/or a high current.

Figure 9:
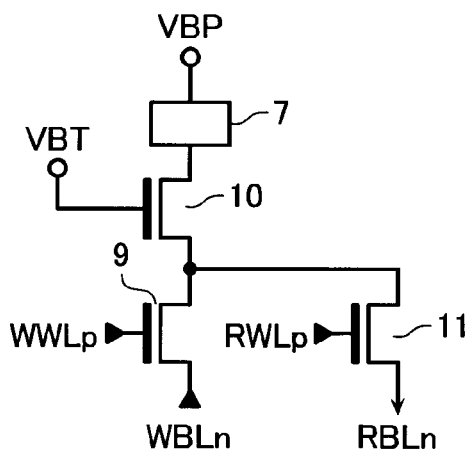
FIG. 9 shows another example configuration of the memory cell 1 according to the second embodiment.

FIG. 9 shows another detailed example of the memory cell 1 that may be used in the second embodiment. The memory cell 1 in FIG. 9 differs from that in FIG. 8 in that the barrier device 10 is shared by the devices 9 and 11. The device 10 serves to prevent the application of a high voltage stress to the write selection device 9 and the read selection device 11.

Figure 10:
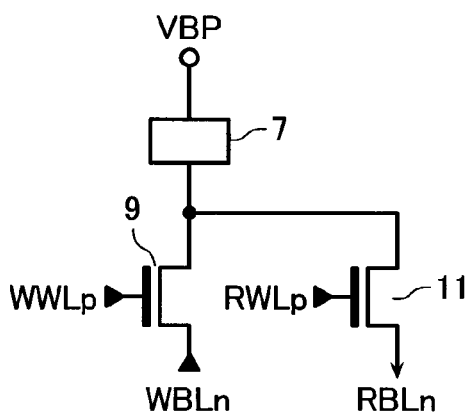
FIG. 10 shows another example configuration of the memory cell 1 according to the second embodiment.

FIG. 10 shows still another example configuration of the memory cell 1 that may be used in the second embodiment. In this example, the barrier device 10 shown in FIGS. 8 and 9 is omitted, and thus the write selection device 9 and the read selection device 11 are directly connected to the antifuse device 7. This configuration may be applied if the devices 8 and 9 may sufficiently withstand the high voltage stress during the write operation.

Third Embodiment

Figure 11:
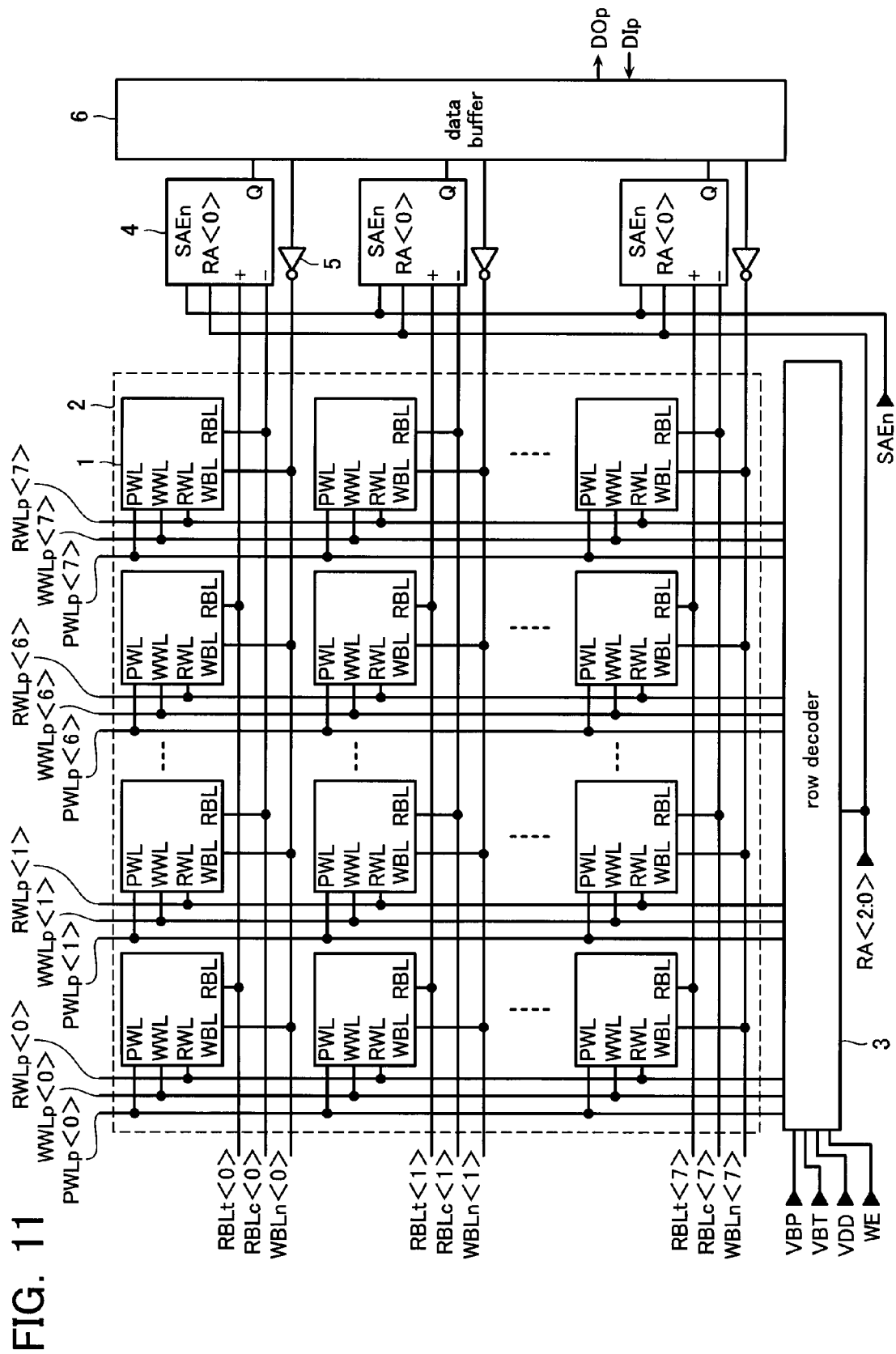
FIG. 11 shows an entire configuration of a non-volatile semiconductor storage device according to a third embodiment of the present invention.

FIG. 11 shows a third embodiment of the present invention. The third embodiment differs from the second embodiment in that in parallel with the word-lines WWLp <i> and RWLp <i>, row power-supply lines PWLp <i> are provided to selectively supply write voltages VBP to the selected memory cells 1. Other elements similar to those in the second embodiment are designated with like reference numerals in the drawing, and their detailed description is omitted here.

Figure 12:
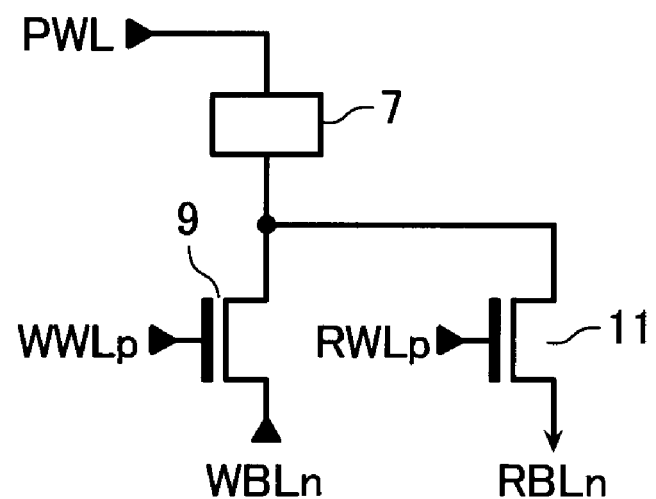
FIG. 12 shows an example configuration of the memory cell 1 according to the third embodiment.

FIG. 12 shows a detailed example of the memory cell 1 that may be used in the third embodiment. In FIG. 12, the memory cell 1 includes the antifuse device 7, the write selection device 9 that is selectively rendered conductive during the write operation, and the read selection device 11 that is selectively rendered conductive during the read operation.

The antifuse device 7 has one terminal connected to the row power-supply terminal PWL. The row power-supply terminal PWL is connected to the row power-supply line PWLp <i> in FIG. 11. The antifuse device 7 has the other terminal connected to the write bit-line WBLn via the write selection device 9. The other terminal is also connected to the read bit-line RBLn via the read selection device 11.

The write selection device 9 has a gate, to which any of the write word-lines WWLp <i> is connected. The read selection device 11 has a gate, to which any of the read word-lines RWLp <i> is connected.

In FIG. 11, the row power-supply line PWLp <i>, the write word-line WWLp <i>, and the read word-line RWLp <i> are lines whose any one row is activated by the row-address signal (RA <2:0>). Note, however, that the row signal potential is different for the write operation and for the read operation. To set each row signal to the necessary potential, the row decoder 3 is applied with three power supplies i.e., the write power supply VBP, the barrier power supply VBT, and the logic power supply VDD. The logic power supply VDD is a power supply to be supplied to the logic circuits. The VDD provides a voltage in which the useful lives of the semiconductor devices included in the logic circuits are ensured.

Data write and read operations in the third embodiment are performed in the following procedure.

First, in a standby state before starting the write operation, all of word-lines PWLp <i>, WWLp <i>, and RWLp <i> are preferably set to 0 V for the purpose of the standby-current reduction. At least to ensure the device reliability, the row power-supply line PWLp <i> should be equal to the logic power supply VDD or less.

During the writing, the unselected row power-supply lines PWLp <i> are set to 0 V, and the selected row power-supply lines PWLp <i> are set to the write power supply VBP. In addition, the unselected write word-lines WWLp <j> are set to 0 V, and the selected write word-lines WWLp <j> are set to the barrier power supply VBT.

Further, for the purpose of protection of the read selection device 11, the unselected read word-lines RWLp <i> are set to 0 V, and the selected read word-lines RWLp <i> are set to the barrier power supply VBT. Under this condition, the write bit-line WBLn <j> is kept at the barrier power supply VBT potential, and the read bit-line RBLt <j> or RBLc <j> is kept at the barrier power supply VBT or a high impedance state. This may avoid the breakdown of the antifuse device 7 and other devices 9 and 11 included in all memory cells 1 and thus secure their safety.

The write bit-line WBLn <j> connected to the memory cell 1 to be written with information is then set to 0 V. At the same time, the write bit-line RBLt <j> or RBLc <j> connected to the memory cell 1 to be written with information is set to 0 V or a high impedance state. This operation may selectively write information in the memory cell 1.

During the reading, the unselected row power-supply lines PWLp <i> are set to 0 V, and the selected row power-supply lines PWLp <i> are set to the logic power supply VDD. In addition, the unselected read word-lines RWLp <i> are set to 0 V, and the selected read word-lines RWLp <i> are set to the barrier power supply VBT. The write word-line WWLp <i> is set to 0 V to be kept non-activated, whether it is selected or unselected. This operation may selectively read information from the memory cell 1 to the read bit-lines RBLt <j> and RBLc <j>. All devices included in the semiconductor memory device are not subject to excessive stresses.

Thus, although the invention has been described with respect to particular embodiments thereof, it is not limited to those embodiments. It will be understood that various modifications and additions and the like may be made without departing from the spirit of the present invention. Although, for example, in the above embodiments, the devices 8 to 11 included in the memory cell are the n-type MOS transistors, the devices may be replaced with the p-type MOS transistors and the row decoder 3 and the write buffer 5 may be changed to the corresponding circuit configurations. In addition, the write power supply VBP and the barrier power supply VBT may be set to high negative potentials lower than the ground potential of 0 V.

What is claimed is:

1. A non-volatile semiconductor storage device comprising:
    a memory cell array comprising memory cells disposed in a matrix;
    a plurality of word-lines arranged in the memory cell array, the word-lines being for selecting a memory cell in a row direction;
    a read bit-line pair arranged in a direction perpendicular to the word-line, the read bit-line pair being for reading data from the memory cell;
    a write bit-line arranged in the direction perpendicular to the word-line, the write bit-line being for writing data to the memory cell; and
    a sense amplifier amplifying a potential difference generated across the read bit-line pair,
    the read bit-line pair comprising a true and a complementary read bit-line, one of the true and complementary read bit-lines being connected to a memory cell connected to an even-numbered word-line, and the other one being connected to a memory cell connected to an odd-numbered word-line.

2. The non-volatile semiconductor storage device according to claim 1, wherein
    the memory cell comprises an antifuse device, the antifuse device having a first end connected to a write power supply, the antifuse device storing data depending on whether a dielectric breakdown occurs due to a voltage applied across the first end and a second end of the antifuse device.

3. The non-volatile semiconductor storage device according to claim 1, further comprising:
    a latch circuit latching an output signal of the sense amplifier; and
    a selection switch receiving a latch signal latched by the latch circuit and a row-address signal, the selection switch inverting or not inverting the latch signal and outputting a resulting signal depending on whether the row-address signal indicates an even-numbered memory cell or an odd-numbered memory cell.

4. The non-volatile semiconductor storage device according to claim 1, wherein
    the write bit-line is formed as sandwiched between the corresponding read bit-line pair.

5. The non-volatile semiconductor storage device according to claim 1, wherein
    the word-line comprises a write word-line that is activated in data writing and a read word-line that is activated in data reading.

6. The non-volatile semiconductor storage device according to claim 1, wherein
    the memory cell comprises:
    an antifuse device having a first end connected to a write power supply, the antifuse device storing data depending on whether a dielectric breakdown occurs due to a voltage applied across the first end and a second end of the antifuse device;
    a write-selection transistor connected between the second end of the antifuse device and the write bit-line, the write-selection transistor being rendered conductive by a selection of the word-line; and
    a read-selection transistor connected between the second end of the antifuse device and the read bit-line, the read-selection transistor being rendered conductive by the selection of the word-line.

7. The non-volatile semiconductor storage device according to claim 6, wherein
    the write-selection transistor has a larger size than the read-selection transistor.

8. The non-volatile semiconductor storage device according to claim 6, wherein
    the memory cell further comprises a barrier transistor, the barrier transistor being connected between the second end of the antifuse device and the read-selection transistor, the barrier transistor protecting the read-selection transistor.

9. The non-volatile semiconductor storage device according to claim 8, wherein
    the write-selection transistor has a larger size than the barrier transistor and the read-selection transistor.

10. The non-volatile semiconductor storage device according to claim 6, wherein
    the word-line comprises a write word-line that is selected in data writing and a read word-line that is selected in data reading, the write-selection transistor is rendered conductive by a selection of the write word-line, and the read-selection transistor is rendered conductive by a selection of the read word-line.

11. The non-volatile semiconductor storage device according to claim 1, wherein the write bit-line is a wiring of a single-line structure.

12. The non-volatile semiconductor storage device according to claim 11, wherein the write bit-line is formed as sandwiched between the corresponding read bit-line pair.

13. The non-volatile semiconductor storage device according to claim 11, wherein the write bit-line has a line width larger than that of one of the read bit-line pair.

14. The non-volatile semiconductor storage device according to claim 1, wherein the sense amplifier comprises:

a first-current bias circuit flowing a bias current through one of the read bit-line pair; and a second-current bias circuit flowing a second bias current through the other one of the read bit-line pair.

15. The non-volatile semiconductor storage device according to claim 14, further comprising:

a first bias-current control circuit activating the first-current bias circuit to supply said bias current through one of the read bit-line pair when an even-numbered memory cell is selected; and a second bias-current control circuit activating the second-current bias circuit to supply said second bias current through the other one of the read bit-line pair when an odd-numbered memory cell is selected.

* * * * *